(12) United States Patent
Hatakeyama et al.

(10) Patent No.: US 8,071,465 B2
(45) Date of Patent: Dec. 6, 2011

(54) METHOD FOR PRODUCING SEMICONDUCTOR CHIP WITH ADHESIVE FILM, ADHESIVE FILM FOR SEMICONDUCTOR USED IN THE METHOD, AND METHOD FOR PRODUCING SEMICONDUCTOR DEVICE

(75) Inventors: Keiichi Hatakeyama, Tsukuba (JP); Yuuki Nakamura, Hitachi (JP)

(73) Assignee: Hitachi Chemical Company, Ltd., Tokyo (JP)

( * ) Notice: Subject to any disclaimer, the term of this patent is extended or adjusted under 35 U.S.C. 154(b) by 0 days.

(21) Appl. No.: 12/682,256

(22) PCT Filed: Oct. 7, 2008

(86) PCT No.: PCT/JP2008/068236
§ 371 (c)(1),
(2), (4) Date: Jun. 10, 2010

(87) PCT Pub. No.: WO2009/048060
PCT Pub. Date: Apr. 16, 2009

(65) Prior Publication Data
US 2010/0267199 A1 Oct. 21, 2010

(30) Foreign Application Priority Data
Oct. 9, 2007 (JP) .................. 2007-263346

(51) Int. Cl.
*H01L 21/00* (2006.01)
(52) U.S. Cl. .................. 438/464; 257/E25.016
(58) Field of Classification Search .................. 438/463, 438/464; 257/E25.016
See application file for complete search history.

(56) References Cited

U.S. PATENT DOCUMENTS
2006/0128065 A1* 6/2006 Inada et al. .................. 438/118

FOREIGN PATENT DOCUMENTS

| CN | 1799126 | 7/2006 |
|---|---|---|
| JP | 2002-192370 | 7/2002 |
| JP | 2003-017513 | 1/2003 |
| JP | 2003-338467 | 11/2003 |
| JP | 2006-086509 | 3/2006 |
| JP | 2006-203133 | 8/2006 |
| WO | WO 2004/109786 | 12/2004 |
| WO | WO 2008/126718 | 10/2008 |

OTHER PUBLICATIONS

Translation of the Preliminary Report on Patentability mailed May 20, 2010, for Application No. PCT/JP2008/068236, filed Oct. 7, 2008.
Chinese Official Action dated Jul. 18, 2011, for CN Application No. 200880110812.4.

* cited by examiner

*Primary Examiner* — Jenny L Wagner
(74) *Attorney, Agent, or Firm* — Antonelli, Terry, Stout & Kraus, LLP.

(57) ABSTRACT

A method for producing a semiconductor chip with an adhesive film, which includes: preparing a laminate in which a semiconductor wafer, an adhesive film and a dicing tape are laminated in that order, the adhesive film having a thickness in the range of 1 to 15 μm and a tensile elongation at break of less than 5%, and the tensile elongation at break being less than 110% of the elongation at a maximum load, and the semiconductor wafer having a section, for dividing the semiconductor wafer into a plurality of semiconductor chips, which is formed by irradiating with laser light; dividing the semiconductor wafer into a plurality of semiconductor chips without dividing the adhesive film, by expanding the dicing tape; and dividing the adhesive film by picking up the plurality of semiconductor chips.

2 Claims, 5 Drawing Sheets

METHOD FOR PRODUCING SEMICONDUCTOR CHIP WITH ADHESIVE FILM, ADHESIVE FILM FOR SEMICONDUCTOR USED IN THE METHOD, AND METHOD FOR PRODUCING SEMICONDUCTOR DEVICE

TECHNICAL FIELD

The present invention relates to a method for producing a semiconductor chip with an adhesive film, an adhesive film for a semiconductor used in the method and a method for producing a semiconductor device.

BACKGROUND ART

Heretofore, silver paste has been mainly used for bonding a semiconductor chip and a semiconductor chip mounting support member. However, with the downsizing and high performance of semiconductor chips and the downsizing and miniaturization of support members used, some problems have arisen with the method using silver paste, such as the occurrence of failures in wire bonding caused by the extrusion of paste or inclined semiconductor chips, the difficulty in controlling the film thickness of adhesive layers and the generation of voids in adhesive layers. Also, in the field of mobile devices where further miniaturization and a higher density are required, semiconductor devices in which a plurality of semiconductor chips are laminated have been developed and mass-produced, and the above problems tend to become apparent particularly when such semiconductor devices are produced. For the above reasons, film adhesives (hereinafter referred to as an adhesive film for a semiconductor) have been recently used instead of silver paste.

Examples of methods of producing a semiconductor device using an adhesive film for a semiconductor include: (1) a piece lamination process in which an adhesive film for a semiconductor which has been cut in any size is laminated on a semiconductor chip mounting support member such as a wiring board or a semiconductor chip, and a semiconductor chip is bonded thereto by thermocompression bonding; and (2) a wafer back-side lamination process, in which an adhesive film for a semiconductor is laminated on the back side of a semiconductor wafer and the resultant is cut into pieces with a rotary blade to prepare a semiconductor chip with an adhesive film, and the chip is bonded to a semiconductor chip mounting support member or a semiconductor chip by thermocompression bonding. Recently, to simplify the production process of semiconductor devices, the wafer back-side lamination process described in the above (2) has become the mainstream.

In the wafer back-side lamination process, it has been common to cut a semiconductor wafer on which an adhesive film for a semiconductor is laminated with a rotary blade as described above. However, cutting a semiconductor wafer and an adhesive film simultaneously by a general dicing method using a rotary blade has had the problem of the occurrence of cracks (chip cracks) at the edge of the semiconductor chip after cutting or the occurrence of much flash due to the rough section of the adhesive film. The presence of such chip cracks and flash makes it easier for semiconductor chips to be broken when they are picked up. In particular, picking up semiconductor chips cut from a thinned semiconductor wafer without cracks becomes difficult.

So recently a method called stealth dicing, in which a reformed section is selectively formed in a semiconductor wafer by irradiating the semiconductor wafer with laser light and the semiconductor wafer is cut along the reformed section has been proposed as a method for dicing a semiconductor wafer (see, for example, Patent Documents 1 and 2). In this method, the semiconductor wafer in which a reformed section has been formed is attached to a dicing tape, and the semiconductor wafer is divided into a plurality of semiconductor chips along the reformed section by applying stress to the semiconductor wafer by expanding the dicing tape.

Patent Document 1: Japanese Patent Laid-Open No. 2002-192370

Patent Document 2: Japanese Patent Laid-Open No. 2003-338467

DISCLOSURE OF THE INVENTION

However, completely dividing an adhesive film for a semiconductor only by the expanding mechanism of a die bonder is difficult and a separate expanding device is necessary for dividing the adhesive film for a semiconductor. Therefore, even in the stealth dicing method, further improvement is required for dividing an adhesive film in order to achieve both assembling properties and reliability in the manufacture of semiconductor devices.

The present invention has been made in view of the above-described circumstances and an object of the present invention is to provide a method for producing a semiconductor chip with an adhesive film, capable of producing a semiconductor chip from a semiconductor wafer at a good yield and capable of producing a semiconductor chip with an adhesive film laminated thereon in which flash is sufficiently little and which has substantially the same shape as that of the semiconductor chip, an adhesive film for a semiconductor suitably used in the method for producing a semiconductor chip with an adhesive film, and a method for producing a semiconductor device capable of achieving both assembling properties and reliability.

To solve the above problem, the method for producing a semiconductor chip with an adhesive film of the present invention comprises steps of: preparing a laminate in which a semiconductor wafer, an adhesive film for a semiconductor and a dicing tape are laminated in that order, the adhesive film for a semiconductor having a thickness in the range of 1 to 15 µm and a tensile elongation at break of less than 5%, and the tensile elongation at break being less than 110% of the elongation at a maximum load, and the semiconductor wafer having a reformed section for dividing the semiconductor wafer into the plurality of semiconductor chips, which is formed by irradiating with laser light; dividing the semiconductor wafer into the plurality of semiconductor chips without dividing the adhesive film for a semiconductor by expanding the dicing tape in a direction in which the plurality of semiconductor chips are each separated; and dividing the adhesive film for a semiconductor by picking up the plurality of semiconductor chips in a laminating direction of the laminate, thereby preparing a semiconductor chip with an adhesive film.

According to the method for producing a semiconductor chip with an adhesive film of the present invention, by combining a stealth dicing process and the above-described specific adhesive film for a semiconductor, and by dividing the adhesive film for a semiconductor using the shearing force generated when picking up semiconductor chips, a semiconductor chip can be produced from a semiconductor wafer at a good yield, and a semiconductor chip with an adhesive film laminated thereon in which flash is sufficiently little and which has substantially the same shape as that of the semiconductor chip can be prepared.

When the thickness of an adhesive film for a semiconductor is less than 1 µm, preparing the adhesive film becomes difficult, and when the thickness is more than 15 µm, dividing the adhesive film for a semiconductor by picking up of semiconductor chips becomes difficult. When the adhesive film for a semiconductor has a tensile elongation at break of 5% or more, the amount of expansion of the dicing tape needs to be made greater than usual. When the ratio of the tensile elongation at break to the elongation at the maximum load is 110% or more, completely dividing the adhesive film for a semiconductor with preventing flash from occurring becomes difficult, and so preparing an adhesive film suited to the shape of semiconductor chips becomes difficult.

The method for producing a semiconductor device of the present invention includes a step of bonding the semiconductor chip with an adhesive film obtained by the method for producing a semiconductor chip with an adhesive film of the present invention to another semiconductor chip or a semiconductor chip mounting support member.

The method for producing a semiconductor device of the present invention makes it possible to achieve both assembling properties and reliability by using a semiconductor chip with an adhesive film obtained by the method for producing a semiconductor chip with an adhesive film of the present invention.

The present invention also provides an adhesive film for a semiconductor used in the method for producing a semiconductor chip with an adhesive film of the present invention, which has a thickness in the range of 1 to 15 µm and a tensile elongation at break of less than 5%, and in which the tensile elongation at break is less than 110% of the elongation at the maximum load.

EFFECT OF THE INVENTION

The present invention can provide a method for producing a semiconductor chip with an adhesive film, capable of producing a semiconductor chip from a semiconductor wafer at a good yield and capable of producing a semiconductor chip with an adhesive film laminated thereon in which flash is sufficiently little and which has substantially the same shape as that of the semiconductor chip, an adhesive film for a semiconductor suitably used in the method for producing a semiconductor chip with an adhesive film and a method for producing a semiconductor device capable of achieving both assembling properties and reliability.

BEST MODES FOR CARRYING OUT THE INVENTION

Hereinafter preferred embodiments of the present invention will be described in detail.

Figure 2:
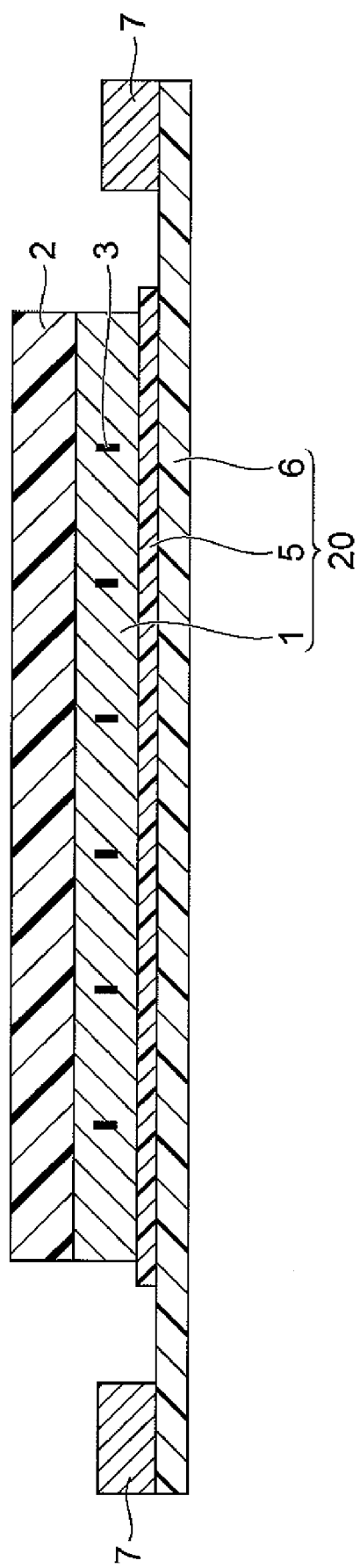
FIG. 2 is a schematic cross-sectional view illustrating a method for producing a semiconductor chip with an adhesive film according to an embodiment.
Figure 3:
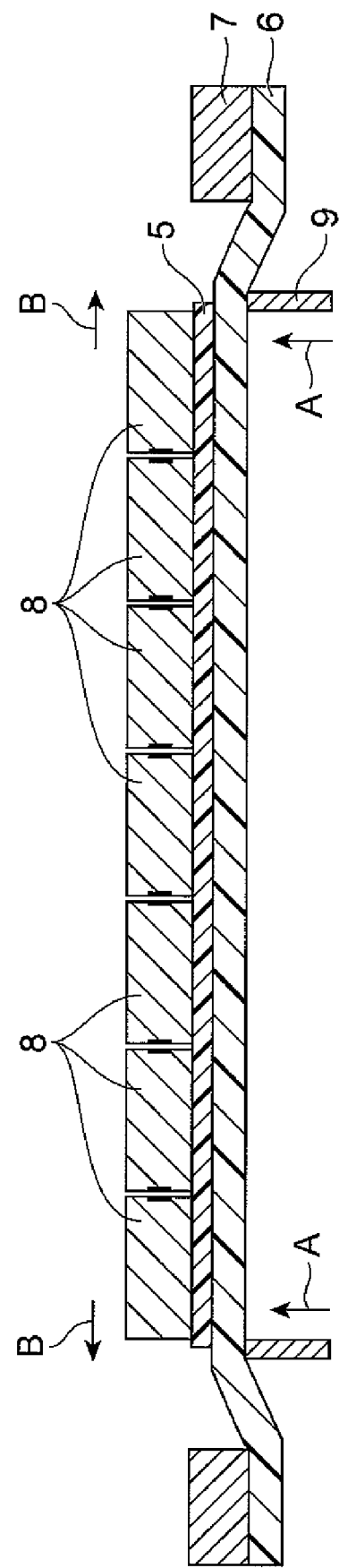
FIG. 3 is a schematic cross-sectional view illustrating a method for producing a semiconductor chip with an adhesive film according to an embodiment.
Figure 4:
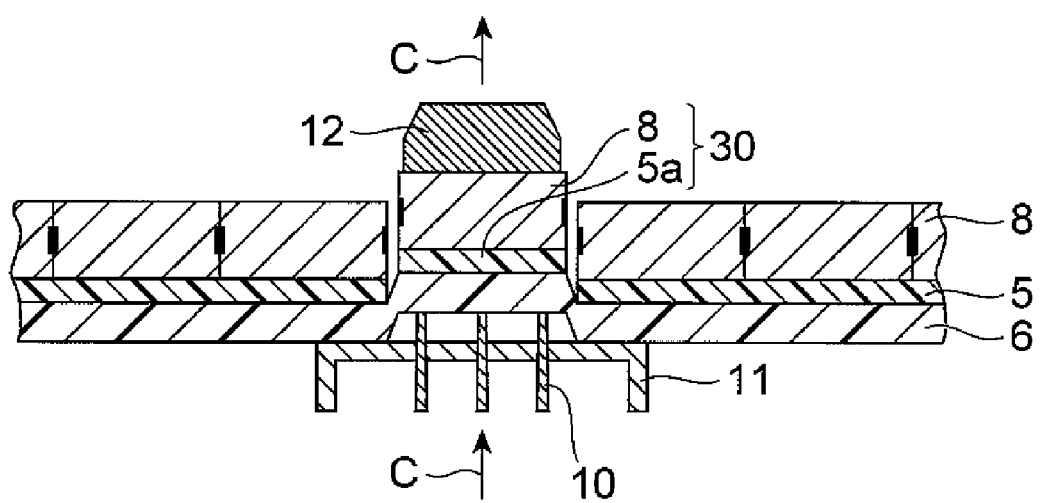
FIG. 4 is a schematic cross-sectional view illustrating a method for producing a semiconductor chip with an adhesive film according to an embodiment.

FIGS. 1, 2, 3 and 4 are schematic cross-sectional views illustrating a preferred embodiment of the method for producing a semiconductor chip with an adhesive film of the present invention. The method for producing a semiconductor chip with an adhesive film according to this embodiment comprises steps of preparing a laminate 20 in which a semiconductor wafer 1, an adhesive film 5 for a semiconductor of the present invention and a dicing tape 6 are laminated in that order (FIG. 2); dividing the semiconductor wafer 1 into a plurality of semiconductor chips 8 without dividing the adhesive film 5 for a semiconductor by expanding the dicing tape 6 in a direction in which the plurality of semiconductor chips 8 are each separated (FIG. 3); and dividing the adhesive film 5 for a semiconductor by picking up each of the plurality of semiconductor chips 8 in a laminating direction of the laminate, thereby preparing a semiconductor chip 30 with an adhesive film (FIG. 4). The semiconductor chip 30 with an adhesive film produced through these steps has an adhesive film 5a in which flash is sufficiently little and which has substantially the same shape as the semiconductor chip 8.

Figure 1:
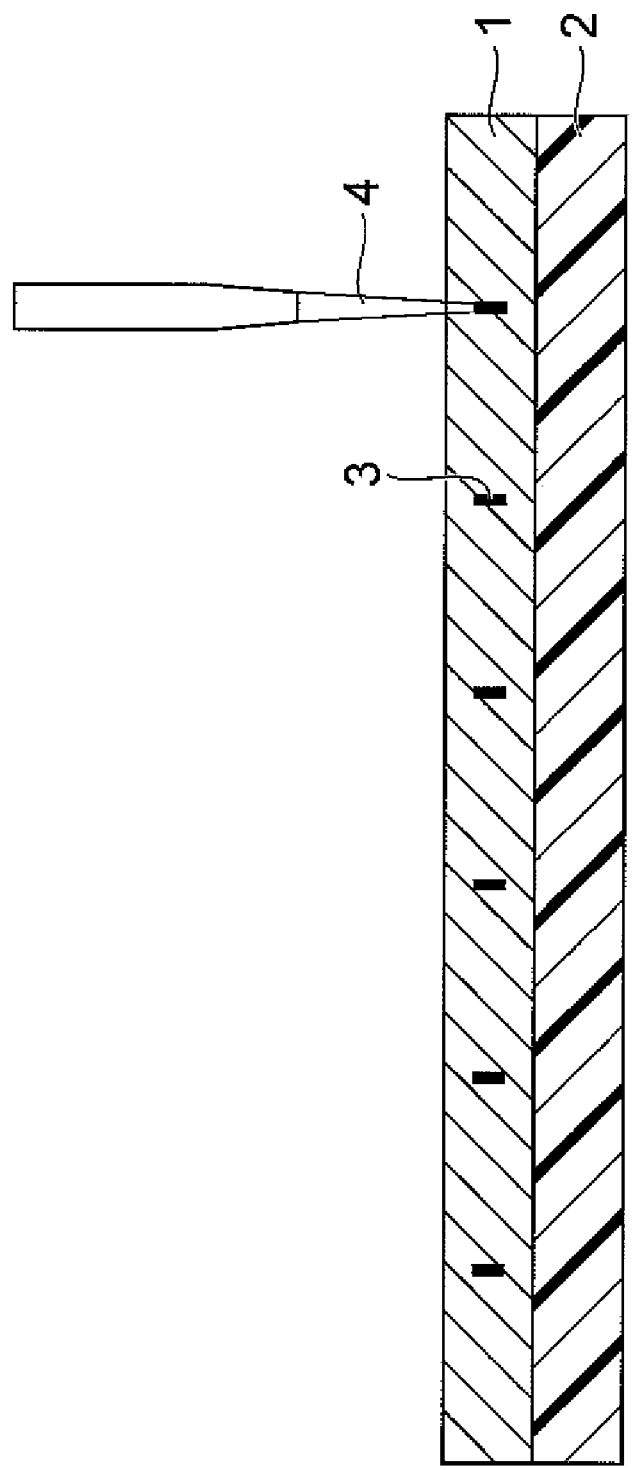
FIG. 1 is a schematic cross-sectional view illustrating a method for producing a semiconductor chip with an adhesive film according to an embodiment.

The semiconductor wafer 1 shown in FIG. 2 has a reformed section 3 for dividing the semiconductor wafer into the plurality of semiconductor chips, which is formed by irradiating with laser light. The reformed section 3 can be selectively formed, for example, by irradiating a laminate of the semiconductor wafer 1 and a back grind tape 2 from the opposite side of the circuit side of the semiconductor wafer 1 with laser light 4 (FIG. 1). The processing by irradiation of laser light may be performed under conditions generally employed in the method known as so-called stealth dicing.

A wafer composed of single crystalline silicon, polycrystalline silicon, various ceramics or compound semiconductors such as gallium arsenide is used as the semiconductor wafer 1. Polyethylene terephthalate tapes or the like are used as the back grind tape 2.

The laminate 20 is prepared by a process of attaching an adhesive film 5 for a semiconductor and a dicing tape 6 in that order to the back side of the semiconductor wafer 1 in which a reformed section 3 is formed (the side opposite from the back grind tape 2 side), or a process of attaching a composite sheet in which an adhesive film 5 for a semiconductor and a dicing tape 6 are laminated to the back side of the semiconductor wafer 1 in such a direction that the adhesive film 5 for a semiconductor is on the side of the semiconductor wafer 1. The orders in the process of preparing the laminate 20 are not limited to those in this embodiment. For example, the reformed section may be formed by laser processing after attaching an adhesive film for a semiconductor to a semiconductor wafer.

Any tape may be used as the dicing tape 6 without particular limitation as long as it has enough adhesiveness to be fixed to a fixing ring and can be expanded in such a manner that the semiconductor wafer 1 is divided along the reformed section 3. For example, vinyl chloride tape may be used as the dicing tape. Examples of commercially available tapes include "AF-80H" and "T-80MW" (trade names, available from DENKI KAGAKU KOGYO K.K.).

FIG. 2 illustrates a case where the back grind tape 2 is laminated on the semiconductor wafer 1. The back grind tape 2 will be peeled off before the next step. Also, the dicing tape 6 of the laminate 20 shown in FIG. 2 has a wafer ring 7 which is a fixing ring.

In the step of dividing the semiconductor wafer 1 into a plurality of semiconductor chips 8, the dicing tape 6 is expanded in such a direction that the plurality of semiconductor chips 8 are each separated (in the direction of arrow B in FIG. 3) by holding up an expand ring 9 from the bottom side of the dicing tape 6 (in the direction of arrow A in FIG. 3). And then the semiconductor wafer 1 is divided into a plurality of semiconductor chips 8 from the reformed section 3. Since it is not necessary to cut the semiconductor wafer 1 with a dicing blade in this method, the rate of preparing semiconductor wafer pieces can be increased. The dicing tape 6 may be expanded using a die bonder.

The adhesive film 5 for a semiconductor is not divided in the above-described expansion step, but divided in the subsequent pick-up step. Therefore, the dicing tape 6 may be expanded to an extent that enables the semiconductor wafer 1 to be divided. For the amount of expansion of the dicing tape 6, when the dicing tape 6 has an initial maximum width in the range of 200 to 300 mm, the difference between the (maximum) width of the dicing tape 6 after expansion and the (maximum) initial width of the dicing tape 6 is preferably 1 to 20 mm, more preferably 2 to 15 mm, and further preferably 3 to 10 mm.

The amount of expansion of the dicing tape 6 in this embodiment can be smaller than that when cutting a conventional adhesive film for a semiconductor by expansion. Therefore, it is unnecessary to make arrangements for an additional expanding device employed in the conventional stealth dicing process.

In this embodiment, the rate of expansion (expansion rate) of the dicing tape 6 is preferably 1 to 50 mm/second, more preferably 2 to 30 mm/second, and further preferably 3 to 20 mm/second. When the expansion rate is less than 1 mm/second, completely dividing the semiconductor wafer 1 may become difficult.

In the step of picking up the plurality of semiconductor chips, the bottom side of the expanded dicing tape is vacuum sucked by a suction dome 11, and the portion where a semiconductor chip to be picked up is located is pushed up by a push-up needle 10, thereby picking up the semiconductor chip 8 by a pick-up collet 12 in the laminating direction of the laminate (the direction of arrow C in FIG. 4). At this stage, a shearing force acts in the thickness direction of the adhesive film 5 for a semiconductor, and the adhesive film 5 is divided in the shape of the semiconductor chip 8. In this way, a semiconductor chip 30 with an adhesive film 5a laminated thereon in which flash is sufficiently little and which has substantially the same shape as that of the semiconductor chip is produced.

For pick-up systems used in the above-described step, systems developed for thin chips, such as multi-pin push-up systems and three-stage push-up systems, made by Renesas Eastern Japan Semiconductor, Inc. are preferred.

When using the multi-pin push-up system or a usual pin push-up system, pins are preferably disposed near and between the four corners of a chip at regular intervals. In the multi-pin push-up system, in particular, the suction effect from the bottom side of the dicing tape is decreased when too many pins are disposed, and therefore it is preferable to dispose about 9 pins if they have a size of about 10 mm×10 mm.

Also, it is preferred that a pick-up collet 12 for picking up a semiconductor chip has substantially the same size as the chip. For the condition of the pushing up of pins, the push-up height is preferably up to 2000 µm or less, preferably 700 µm or less, more preferably 600 µm or less, and further preferably 500 µm or less. Pushing up to a height of more than 2000 µm is not preferred because the chip may be cracked.

Pins are pushed up at a rate of preferably 20 to 200 mm/s, more preferably 30 to 150 mm/s and further preferably 50 to 100 minis. Pushing up at less than 20 mm/s is not preferred because dividing die-bonding film upon pushing up tends to become difficult. Pushing up at more than 200 mm/s is not preferred because semiconductor chips are more likely to be broken by shock.

In this embodiment, pushing up may be performed in two or more stages. For example, pins may be pushed up under the conditions of a push-up height of 250 to 1000 µm and a push-up rate of 50 to 100 mm/s in the first stage, and under the conditions of a push-up height of 1000 to 2000 µm and a push-up rate of 1 to 30 mm/s in the second stage.

In this embodiment, by applying the specific adhesive film for a semiconductor of the present invention, an adhesive film 5a in which flash is sufficiently little and which has substantially the same shape as that of the semiconductor chips is separated from the adhesive film for a semiconductor in the above-described pick-up step.

In the following, an adhesive film for a semiconductor according to the present invention will be described.

The adhesive film for a semiconductor according to the present invention has a thickness in the range of 1 to 15 µm and a tensile elongation at break of less than 5%, and the tensile elongation at break is less than 110% of the elongation at the maximum load. Such an adhesive film for a semiconductor is composed of a thermosetting resin and/or a thermoplastic resin.

When the thickness of an adhesive film for a semiconductor is less than 1 µm, preparing the adhesive film becomes difficult, and when the thickness is more than 15 µm, dividing the adhesive film for a semiconductor by picking up of semiconductor chips becomes difficult. When the adhesive film for a semiconductor has a tensile elongation at break of 5% or more, it is necessary to expand the dicing tape in a greater degree than usual. A ratio of a tensile elongation at break to the elongation at the maximum load of 110% or more means long duration of a yielded state or high possibility of the occurrence of necking. In such cases, completely dividing the adhesive film for a semiconductor with preventing flash from occurring becomes difficult, and so preparing an adhesive film suited to the shape of semiconductor chips becomes difficult.

From the above-described reason, the adhesive film for a semiconductor has a tensile elongation at break of preferably less than 4%, more preferably less than 3.5%. Likewise, the ratio of a tensile elongation at break to the elongation at the maximum load is preferably less than 108%, more preferably less than 105%. The ratio is the lowest, 100%, when the tensile elongation at break and the elongation at the maximum load are the same.

The maximum stress, the elongation at the maximum load and the tensile elongation at break are measured by a tensile test at 25° C. using a strip test piece having a width of 5 mm, a length of 50 mm and a thickness of 25 µm cut from a B-stage adhesive film for a semiconductor under the following conditions.

Tensile tester: 100N Autograph "AGS-100NH" made by Shimadzu Corporation
Chuck distance (at start of test): 30 mm
Tensile rate: 5 mm/minute The maximum load, chuck distance at the maximum load and chuck distance at break are read from a stress-strain curve obtained in the tensile test, and using these values and the measured value of the cross-sectional area of a sample, the maximum stress, the elongation at the maximum load and the tensile elongation at break are calculated by the following formula.

Maximum stress (Pa)=maximum load (N)/cross sectional area (m$^2$) of sample

Elongation at maximum load (%)={(chuck distance (mm) at maximum load−30)/30}×100

Tensile elongation at break (%)={(chuck distance (mm) at break−30)/30}×100

Generally, a plurality of test pieces is subjected to measurement and the mean value is recorded as the tensile properties of the adhesive film for a semiconductor. The tensile test is preferably carried out under the above-described conditions in consideration of reproducibility, but they may be changed to other conditions which produce substantially the same test results.

The adhesive film for a semiconductor has a thickness of preferably 3 to 15 μm, more preferably 5 to 15 μm in consideration of the adhesion to an adherend and separability of a film.

The adhesive film 5 for a semiconductor preferably contains a high molecular weight component, a thermosetting component and a filler. By using these components to prepare an adhesive film 5 for a semiconductor and adjusting the types of components and their amounts, an adhesive film 5 for a semiconductor having the above-described specific tensile properties can be produced. Thermoplastic resins are preferred as the high molecular weight component.

The high molecular weight component constituting the adhesive film for a semiconductor preferably has a glass transition temperature (Tg) of 60° C. or lower. Also, a high molecular weight component having a heat resistance of 300° C. or higher is preferred. Examples of preferred high molecular weight components include polyimide resins, polyamide imide resins, phenoxy resins, acrylic resins, polyamide resins and urethane resins. These may be used alone or in combination of two or more. Of them, polyimide resins are particularly preferred. Using a polyimide resin allows the adhesive film 5 for a semiconductor to have the tensile properties as described above with maintaining a reasonably small filler content.

Thermosetting components mean those which can be formed into a cured product by crosslinking by heating, and are composed of, for example, a thermosetting resin and a curing agent therefor. Thermosetting resins are not particularly limited and conventionally known resins may be used. Of them, in consideration of the convenience for peripheral materials of semiconductors (availability of high purity products, diversity of products and easily controllable reactivity), epoxy resins and imide compounds having at least 2 thermosetting imide groups in a molecule are preferred. Epoxy resins are generally used together with an epoxy resin curing agent.

Epoxy resins preferably contain 2 or more epoxy groups. In consideration of curing properties and properties of cured products, phenol glycidyl ether epoxy resins are preferred. Examples of phenol glycidyl ether epoxy resins include condensates of bisphenol A, bisphenol AD, bisphenol S, bisphenol F or halogenated bisphenol A and epichlorohydrin, glycidyl ether of phenol novolac resin, glycidyl ether of cresol novolac resin and glycidyl ether of bisphenol A novolac resin. Of them, novolac epoxy resins (glycidyl ether of cresol novolac resin, glycidyl ether of phenol novolac resin and the like) are preferred because their cured products have a high crosslinking density and the adhesion strength can be increased upon heating of the film. These may be used alone or in combination of two or more.

Examples of epoxy resin curing agents include phenol compounds, aliphatic amines, alicyclic amines, aromatic polyamines, polyamides, aliphatic acid anhydrides, alicyclic acid anhydrides, aromatic acid anhydrides, dicyandiamides, organic acid dihydrazides, boron trifluoride amine complexes, imidazoles and tertiary amines. Of them, phenol compounds are preferred, and phenol compounds having two or more phenolic hydroxyl groups are particularly preferred. More specifically, naphthol novolac resin and trisphenol novolac resin are preferred. Using these phenol compounds as an epoxy resin curing agent makes it possible to effectively reduce contamination on chip surfaces and devices upon heating for package assembly and the generation of outgas that causes odor.

The tensile properties of the adhesive film for a semiconductor can be controlled by adjusting the content of filler. The higher the content of filler, the smaller the tensile elongation at break may be and the smaller the ratio of the tensile elongation at break to the elongation at the maximum load may be. Also, using an appropriate amount of filler can produce advantages of improving handling properties and thermal conductivity, adjusting melt viscosity and achieving thixotropic properties.

For the above purposes, the filler is preferably an inorganic filler. More specifically, an inorganic filler containing at least one inorganic material selected from the group consisting of aluminum hydroxide, magnesium hydroxide, calcium carbonate, magnesium carbonate, calcium silicate, magnesium silicate, calcium oxide, magnesium oxide, alumina, aluminum nitride, aluminum borate whiskers, boron nitride, crystalline silica, amorphous silica and antimony oxide is preferred. Of them, to improve thermal conductivity, alumina, aluminum nitride, boron nitride, crystalline silica and amorphous silica are preferred. For the purpose of adjusting melt viscosity and achieving thixotropic properties, aluminum hydroxide, magnesium hydroxide, calcium carbonate, magnesium carbonate, calcium silicate, magnesium silicate, calcium oxide, magnesium oxide, alumina, crystalline silica and amorphous silica are preferred. Also, to improve moisture resistance, alumina, silica, aluminum hydroxide and antimony oxide are preferred. A plurality of fillers may be used in combination.

The higher the content of the filler, the smaller the tensile elongation at break and the higher the strength at break may be due to an increased elastic modulus, and the lower the reflow crack resistance may be due to a decrease in adhesiveness. In particular, breaking may easily occur between an adherend such as an organic substrate having irregularities on the surface and a semiconductor chip upon reflow.

Also, a higher content of filler may cause a decrease in the resistance in a reliability test in high-temperature high-humidity environment such as a HAST test. A higher content of filler may also increase the temperature at which an adhesive film for a semiconductor can be attached to a semiconductor wafer. In view of the above situation, the content of the filler is preferably less than 30% by mass, more preferably less than 25% by mass, and further preferably less than 20% by mass based on the total mass of the adhesive film for a semiconductor.

It is preferred that the adhesive film 5 for a semiconductor can be attached to the adherend semiconductor wafer at a temperature of 100° C. or lower. If the peel strength at the interface between an adhesive film for a semiconductor and a semiconductor wafer is 20 N/m or more when the adhesive film for a semiconductor kept at a predetermined temperature is attached to the semiconductor wafer, the adhesive film for a semiconductor is considered to be attachable to the semiconductor wafer. The adhesive film for a semiconductor is attached to a semiconductor wafer using, for example, a hot roll laminator set at a temperature of 100° C. or lower. The peel strength is measured in an atmosphere of 25° C. at a tensile angle of 90° and a tensile rate of 50 mm/minute. An adhesive film for a semiconductor which can be attached to a semiconductor wafer at 100° C. or lower can be prepared by, for example, reducing the content of the filler or using a thermoplastic resin having a low Tg. The temperature at which an adhesive film 5 for a semiconductor can be attached to a semiconductor wafer is preferably 95° C. or lower, more preferably 90° C. or lower. In consideration of the heat resistance of the back grind tape, the adhesive film 5 for a semiconductor can be attached to the adherend semiconductor wafer at a temperature of preferably 80° C. or lower.

The adhesive film 5 for a semiconductor preferably has heat resistance and humidity resistance required when mounting a semiconductor chip on a semiconductor chip mounting support member. To this end, it is preferred that the adhesive film 5 for a semiconductor has passed a reflow crack resistance test. The reflow crack resistance of the adhesive film for a semiconductor can be evaluated based on adhesion strength. To achieve good reflow crack resistance, the peel strength when bonding an adhesive film for a semiconductor to a semiconductor wafer at an adhesion area of 4×2 mm is preferably 1.0 kg/cm or more at an initial stage and 0.5 kg/cm or more after allowing to stand in an atmosphere at 85° C./85% for 48 hours. The initial peel strength is more preferably 1.3 kg/cm or more, and further preferably 1.5 kg/cm. The peel strength after allowing to stand in an atmosphere at 85° C./85% for 48 hours is more preferably 0.7 kg/cm or more, and further preferably 0.8 kg/cm or more.

The adhesive film 5 for a semiconductor may be prepared by a method in which a coating solution containing a high molecular weight component such as a thermoplastic resin, a thermosetting component, a filler and an organic solvent in which they are dissolved or dispersed is applied to a base film, and the organic solvent is removed from the coating solution on the base film by heating.

Organic solvents are not particularly limited as long as materials can be homogeneously dissolved or dispersed in them. Examples thereof include dimethylformamide, dimethylacetamide, N-methylpyrrolidone, dimethyl sulfoxide, diethylene glycol dimethyl ether, toluene, benzene, xylene, methyl ethyl ketone, tetrahydrofuran, ethyl cellosolve, ethyl cellosolve acetate, butyl cellosolve, dioxane, cyclohexanone and ethyl acetate. These may be used alone or in combination of two or more.

Base films are not particularly limited as long as they can withstand heating for removing organic solvents. Examples of base films include polyester films, polypropylene films, polyethylene terephthalate films, polyimide films, polyetherimide films, polyether naphthalate films and methyl pentene films. Multilayer films composed of two or more of these films in combination may also be used as a base film. The surface of the base film may be treated with a silicone or silica release agent. After removing the organic solvent, the base film may not be removed but used as a support for an adhesive film for a semiconductor.

The adhesive film for a semiconductor may be preserved or used in the form of a composite sheet with a dicing tape laminated thereon. Using such a composite sheet makes it possible to simplify the process of producing semiconductor devices.

The adhesive film for a semiconductor used in the method for producing a semiconductor chip with an adhesive film of the present invention may be those prepared as a die bonding film having the following structure.

(a) A die bonding film composed of a base material and an adhesive layer containing a thermosetting resin and/or a thermoplastic resin in that order.

(b) A die bonding film composed of a base material, a pressure-sensitive adhesive layer and an adhesive layer containing a thermosetting resin and/or a thermoplastic resin in that order.

(c) A die bonding film composed of a base material and a pressure-sensitive adhesive/adhesive layer containing a thermosetting resin and/or a thermoplastic resin in that order.

The adhesive layers of the die bonding films (a) and (b) and the pressure-sensitive adhesive/adhesive layer of the die bonding film (c) correspond to the adhesive film for a semiconductor according to the present invention.

When using the die bonding film (a), a laminate according to the present invention can be prepared by either of the following methods.

(1) First, the adhesive layer of the above-described die bonding film (a) and a semiconductor wafer are laminated. Secondly, the base material of the die bonding film is peeled off. And then a pressure-sensitive adhesive layer of a dicing tape material having the pressure-sensitive adhesive layer and a base material in that order is laminated on the adhesive layer.

(2) First, the adhesive layer of the above-described die bonding film (a) and a pressure-sensitive adhesive layer of a dicing tape material having the pressure-sensitive adhesive layer and a base material in that order are laminated. And then the base material of the die bonding film is peeled off and the adhesive layer and a semiconductor wafer are laminated.

When using the die bonding film (b), a laminate according to the present invention can be prepared by the following method.

(3) The adhesive layer of the above-described die bonding film (b) and a semiconductor wafer are laminated. A laminate can be prepared by this procedure when the base material and the pressure-sensitive adhesive layer function as a dicing tape. A laminate may also be prepared by laminating a dicing tape on the pressure-sensitive adhesive layer after peeling off the base material.

When using the die bonding film (c), a laminate according to the present invention can be prepared by the following method.

(4) First, the pressure-sensitive adhesive/adhesive layer of the above-described die bonding film (c) and a semiconductor wafer are laminated. A laminate can be prepared by this procedure when the base material functions as a dicing tape. A laminate may also be prepared by laminating a dicing tape on the pressure-sensitive adhesive layer after peeling off the base material.

As described in the example of using the above-described die bonding film (c), the present invention can also provide a method for producing a semiconductor chip with an adhesive film comprising steps of: preparing a laminate in which a semiconductor wafer, a film-form pressure sensitive adhesive/adhesive and a base material are laminated in that order, the film-form pressure sensitive adhesive/adhesive having a thickness in the range of 1 to 15 µm and a tensile elongation at break of less than 5%, and the tensile elongation at break being less than 110% of the elongation at a maximum load, and the semiconductor wafer having a reformed section for dividing the semiconductor wafer into the plurality of semiconductor chips, which is formed by irradiating with laser light; dividing the semiconductor wafer into the plurality of semiconductor chips without dividing the film-form pressure sensitive adhesive/adhesive by expanding the base material in a direction in which the plurality of semiconductor chips are each separated; and dividing the film-form pressure sensitive adhesive/adhesive by picking up each of the plurality of semiconductor chips in a laminating direction of the laminate, thereby preparing a semiconductor chip with an adhesive film. For the above-described base material, a material which functions as a dicing tape may be used.

Although this embodiment has illustrated a case where the adhesive film for a semiconductor according to the present invention is disposed on the back side of a semiconductor wafer, the method for producing a semiconductor chip with an adhesive film of the present invention can also be applied to a process in which an adhesive film for a semiconductor is attached to the circuit side of a semiconductor wafer.

The semiconductor chip 30 with an adhesive film prepared by the method according to this embodiment as described above constitutes a semiconductor element such as an IC and an LSI. The semiconductor chip 30 with an adhesive film is bonded to another semiconductor chip or a semiconductor chip mounting support member via the adhesive film 5a.

Examples of semiconductor chip mounting support members include lead frames such as 42 alloy lead frames and copper lead frames, a resin film composed of an epoxy resin, a polyimide resin or a maleimide resin, substrates prepared by impregnating nonwoven glass fabric or woven glass fabric with a thermosetting resin such as an epoxy resin, a polyimide resin or a maleimide resin and curing the resultant, and glass substrates and ceramic substrates such as alumina.

Figure 5:
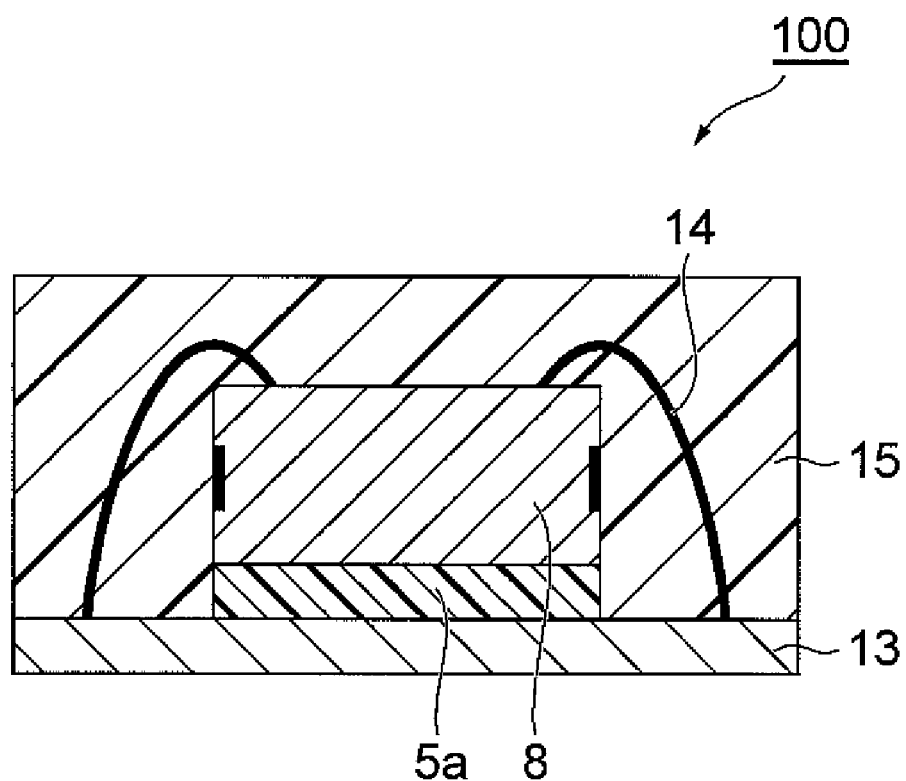
FIG. 5 is a cross-sectional view illustrating an embodiment of a semiconductor device.

FIG. 5 is a cross-sectional view illustrating an embodiment of a semiconductor device prepared by the above method. A semiconductor device 100 shown in FIG. 5 has a wiring board (support member) 13 and the semiconductor chip 8 bonded to the wiring board 13 via the adhesive film 5a. The semiconductor chip 8 is connected to the wiring of the wiring board 13 by means of a binding wire 14. The semiconductor chip 7a is sealed by a sealing resin layer 15 in which the chips are embedded.

A semiconductor chip and a support member, or semiconductor chips with each other, are bonded by heating at 60 to 300° C. for 0.1 to 300 seconds with an adhesive film for a semiconductor interposed between the semiconductor chip and the support member or between the semiconductor chips.

When the adhesive film 5 for a semiconductor contains a thermosetting resin, the semiconductor chip after bonding is preferably heated to facilitate adhesion of the adhesive film for a semiconductor to an adherend or its curing, so as to increase the strength of the bond. Heating conditions may be adjusted based on the composition of the adhesive film, and the semiconductor chip is heated generally at 60 to 220° C. for 0.1 to 600 minutes. When sealed with a resin, the heating in the step of curing the sealing resin may be utilized.

EXAMPLES

In the following, the present invention will be described in more detail by means of Examples. However, the present invention is not limited thereto.

Preparation of Adhesive Film for Semiconductor

Example 1

A 500 ml four-neck flask equipped with a thermometer, a stirrer and a calcium chloride drying tube was charged with diamines, i.e., 1,3-bis(3-aminopropyl)tetramethyldisiloxane (0.06 mol) and 4,9-dioxadecane-1,12-diamine (0.04 mol), and 150 g of N-methyl-2-pyrrolidone as a solvent, and the mixture was stirred at 60° C. to dissolve diamines.

After dissolving diamines, 1,10-(decamethylene)bis(trimellitate dianhydride) (0.02 mol) and 4,4'-oxydiphthalic acid dianhydride (0.08 mol) were added thereto in small portions and the mixture was allowed to react at 60° C. for 3 hours. Then the mixture was heated at 170° C. while blowing $N_2$ gas thereinto to remove water in the system with some of the solvent by azeotropic distillation over 3 hours. A polyimide resin solution was prepared in this way.

To an NMP solution of the polyimide resin prepared above (containing 100 parts by mass of polyimide resin) were added 4 parts by mass of cresol novolac epoxy resin (available from Tohto Kasei Co., Ltd.), 2 parts by mass of 4,4'-[1-[4-[1-(4-hydroxyphenyl)-1-methylethyl]phenyl]ethylidene]bisphenol (available from Honshu Chemical Industry Co., Ltd.) and 0.5 part by mass of tetraphenylphosphonium tetraphenylborate (available from Tokyo Chemical Industry, Co., Ltd.). Further, 12% by mass of a boron nitride filler (available from MIZUSHIMA FERROALLOY CO., LTD.) and 3% by mass of Aerosil filler R972 (available from Nippon Aerosil Co., Ltd.) were added thereto based on the total solid weight, and the mixture was sufficiently kneaded to give a varnish.

The varnish prepared was applied to a release-treated polyethylene terephthalate film (film A31 having a thickness of 50 μm available from Teijin DuPont Films Japan Limited) and the resultant was heated at 80° C. for 30 minutes and then at 120° C. for 30 minutes to give an adhesive film for a semiconductor having a thickness of 5 μm.

Example 2

A varnish prepared in the same manner as in Example 1 was applied to a release-treated polyethylene terephthalate film (film A31 having a thickness of 50 μm available from Teijin DuPont Films Japan Limited) and the resultant was heated at 80° C. for 30 minutes and then at 120° C. for 30 minutes to give an adhesive film for a semiconductor having a thickness of 15 μm.

Comparative Example 1

A varnish prepared in the same manner as in Example 1 was applied to a release-treated polyethylene terephthalate film (film A31 having a thickness of 50 μm available from Teijin DuPont Films Japan Limited) and the resultant was heated at 80° C. for 30 minutes and then at 120° C. for 30 minutes to give an adhesive film for a semiconductor having a thickness of 25 μm.

Comparative Example 2

DF-402 (available from Hitachi Chemical Co., Ltd., trade name, thickness: 15 μm) was prepared as an adhesive film for a semiconductor of Comparative Example 2.

<Evaluation of Adhesive Film>

(Maximum Stress, Elongation at Maximum Load and Tensile Elongation at Break)

A tensile test was performed using a strip test piece (having a width of 5 mm and a length of 50 mm) cut from a B-stage adhesive film. The maximum stress, elongation at the maximum load and tensile elongation at break were calculated from the stress-strain curve obtained based on the following calculation formulas. The tensile test was performed using a tensile tester (100N Autograph AGS-100NH made by Shimadzu Corporation) in an atmosphere of 25° C. under the conditions of a chuck distance at the start of the test of 30 mm and a tensile rate of 5 mm/minute.

Maximum stress (Pa)=maximum load (N)/cross sectional area (m$^2$) of sample

Elongation at maximum load (%)={(chuck distance (mm) at maximum load−30)/30}×100

Tensile elongation at break (%)={(chuck distance (mm) at break−30)/30}×100

<Preparation of Semiconductor Chip with Adhesive Film>

A laminated product of a 50 μm-thick semiconductor wafer (material: single crystalline silicon) having a reformed section formed by irradiating with laser light and a back grind tape was prepared. The reformed section was formed so that the semiconductor wafer can be divided into a size of 10 mm×10 mm.

At the same time, the adhesive films for a semiconductor prepared in Examples and Comparative Examples were each cut out into a circle having a diameter of 210 mm, and the resulting adhesive films for a semiconductor were each laminated on a dicing tape (available from DENKI KAGAKU KOGYO KABUSHIKI KAISHA, trade name "AD-80H", thickness: 80 μm) using a wafer mounter "DM-300H" (made by JCM Co., Ltd., trade name) under the conditions of room temperature, a linear pressure of 5 kgf and 10 mm/s to give a laminated product of the adhesive film for a semiconductor and the dicing tape. A wafer ring was also attached to the dicing tape of the laminated product.

The above-described laminated product of the adhesive film for a semiconductor and the dicing tape was attached to the back side of the semiconductor wafer having a reformed section prepared above using a wafer mounter "DM-300H" (made by JCM Co., Ltd., trade name) under the conditions of a hot plate temperature of 80° C., a linear pressure of 5 kgf and 3 mm/s to prepare a sample laminate. The back grind tape was peeled off before attaching.

The sample laminate prepared above was set on flexible die bonder "DB-730" (made by Renesas Eastern Japan Semiconductor, Inc., trade name) and the dicing tape was expanded by the expanding device. The rate of expansion was 10 mm/s and the amount of expansion was 4 mm. Then, the semiconductor chips in the expanded sample laminate were picked up using the multi-pin push-up jig of flexible bonder "DB-730" (made by Renesas Eastern Japan Semiconductor, Inc.) in which 9 ejector needles (made by Micro-Mechanics Pte Ltd., SEN-83-05, needle diameter: 0.7 mm, tip: semicircular, 350 μm in diameter) are arranged in a grid pattern at an interval of 4.2 mm while pushing up the needles and using a rubber chip (made by Micro-Mechanics Pte Ltd., trade name: 13-087E-33, 10 mm×10 mm) as a pick-up collet. Here the semiconductor chips were picked up while pushing up the needles in two stages; they were pushed up under the conditions of a push-up height of 300 μm and a push-up rate of 89.4 mm/s in the first stage, and under the conditions of a push-up height of 1,500 μm and a push-up rate of 8.94 mm/s in the second stage for a holding time after pushing up (pick-up time) of 500 ms. Pick-up properties in this experiment were evaluated based on the following criteria.

[Pick-Up Properties]

A: The adhesive film for a semiconductor could be cut and the semiconductor chips with an adhesive film were successfully picked up.

B: The adhesive film for a semiconductor could not be completely cut, making it impossible to pick up the semiconductor chips and causing chip cracks.

TABLE 1

|  |  | Unit | Example 1 | Example 2 | Comparative Example 1 | Comparative Example 2 |
| --- | --- | --- | --- | --- | --- | --- |
| Tensile properties | Maximum stress | MPa | 45.9 | 45.9 | 45.9 | 60.0 |
|  | Elongation at maximum load | % | 2.5 | 2.5 | 2.5 | 3.9 |
|  | Tensile elongation at break | % | 2.5 | 2.5 | 2.5 | 10.3 |
|  | Tensile elongation at break/elongation at maximum load | % | 101 | 101 | 101 | 264 |
| Film thickness |  | μm | 5 | 15 | 25 | 15 |
| Pick-up properties |  | — | A | A | B | B |

As Table 1 shows, it has been proved that when using the adhesive films for a semiconductor of Examples 1 and 2 having a thickness in the range of 1 to 15 μm and a tensile elongation at break of less than 5%, and in which the tensile elongation at break is less than 110% of the elongation at the maximum load, the adhesive films for a semiconductor could be divided in the above-described pick-up step, making it possible to prepare semiconductor chips with an adhesive film. It has also been found that flash in the divided adhesive films was sufficiently reduced and the divided adhesive films had substantially the same shape as that of the semiconductor chip. On the other hand, when the adhesive films for a semiconductor of Comparative Examples 1 and 2 were used, the adhesive films for a semiconductor could not be divided in the above-described expansion step or pick-up step.

The above results have proved that the method for producing a semiconductor chip with an adhesive film using an adhesive film for a semiconductor of the present invention is capable of producing a semiconductor chip with an adhesive film laminated thereon in which flash is sufficiently little and which has substantially the same shape as that of the semiconductor chip, and capable of achieving both assembling properties and reliability in a method of producing a semiconductor device based on a stealth dicing process.

INDUSTRIAL APPLICABILITY

The present invention can provide a method for producing a semiconductor chip with an adhesive film, capable of producing a semiconductor chip from a semiconductor wafer at a good yield and capable of producing a semiconductor chip with an adhesive film laminated thereon in which flash is sufficiently little and which has substantially the same shape as that of the semiconductor chip, an adhesive film for a semiconductor suitably used in the method for producing a semiconductor chip with an adhesive film and a method for producing a semiconductor device capable of achieving both assembling properties and reliability.

The invention claimed is:

1. A method for producing a semiconductor chip with an adhesive film, comprising steps of:
    preparing a laminate in which a semiconductor wafer, an adhesive film for a semiconductor and a dicing tape are laminated in that order, the adhesive film for a semiconductor having a thickness in the range of 1 to 15 µm and a tensile elongation at break of less than 5%, and the tensile elongation at break being less than 110% of the elongation at a maximum load, and the semiconductor wafer having a reformed section for dividing the semiconductor wafer into a plurality of semiconductor chips, which is formed by irradiating with laser light;
    dividing the semiconductor wafer into the plurality of semiconductor chips without dividing the adhesive film for a semiconductor by expanding the dicing tape in a direction in which the plurality of semiconductor chips are each separated;
    and dividing the adhesive film for a semiconductor by picking up the plurality of semiconductor chips in a laminating direction of the laminate, thereby preparing a semiconductor chip with an adhesive film.

2. A method for producing a semiconductor device, comprising a step of bonding a semiconductor chip with an adhesive film obtained by the method according to claim 1 to another semiconductor chip or a semiconductor chip mounting support member.

* * * * *